(12) United States Patent
Grützmacher et al.

(10) Patent No.: US 10,988,858 B2
(45) Date of Patent: Apr. 27, 2021

(54) METHOD FOR DEPOSITING A CRYSTAL LAYER AT LOW TEMPERATURES, IN PARTICULAR A PHOTOLUMINESCENT IV-IV LAYER ON AN IV SUBSTRATE, AND AN OPTOELECTRONIC COMPONENT HAVING SUCH A LAYER

(71) Applicant: Forschungszentrum Jülich GmbH, Jülich (DE)

(72) Inventors: Detlev Grützmacher, Niederzier (DE); Stephan Wirths, Aachen (DE); Dan Mihai Buca, Jülich (DE); Siegfried Mantl, Jülich (DE)

(73) Assignee: Forschungszentrum Jülich GmbH, Jülich (DE)

( * ) Notice: Subject to any disclaimer, the term of this patent is extended or adjusted under 35 U.S.C. 154(b) by 0 days.

(21) Appl. No.: 15/318,541

(22) PCT Filed: May 18, 2015

(86) PCT No.: PCT/EP2015/060881
§ 371 (c)(1),
(2) Date: Dec. 13, 2016

(87) PCT Pub. No.: WO2015/189004
PCT Pub. Date: Dec. 17, 2015

(65) Prior Publication Data
US 2017/0121845 A1 May 4, 2017

(30) Foreign Application Priority Data
Jun. 13, 2014 (DE) .................. DE10 2014 108 352

(51) Int. Cl.
*C30B 25/10* (2006.01)
*C30B 25/18* (2006.01)
(Continued)

(52) U.S. Cl.
CPC .............. *C30B 25/10* (2013.01); *C09K 11/66* (2013.01); *C30B 25/02* (2013.01); *C30B 25/183* (2013.01);
(Continued)

(58) Field of Classification Search
CPC ......... H01L 31/02322; H01L 21/02381; H01L 21/02532; H01L 21/0245; H01L 21/02535;
(Continued)

(56) References Cited

U.S. PATENT DOCUMENTS 5,302,231 A * 4/1994 Bovenkerk ........... C23C 16/277
117/89
6,200,893 B1 3/2001 Sneh
(Continued)

FOREIGN PATENT DOCUMENTS

DE 102004034103 A1 4/2005

OTHER PUBLICATIONS

"Reduced pressure CVD growth of Ge and GeSn alloys" s. wirths et al. (Year: 2013).*
(Continued)

*Primary Examiner* — M. A. Golub-Miller
(74) *Attorney, Agent, or Firm* — Whitmyer IP Group LLC

(57) ABSTRACT

A method for monolithically depositing a monocrystalline IV-IV layer that glows when excited and that is composed of a plurality of elements of the IV main group, in particular a GeSn or Si—GeSn layer, the IV-IV layer having a dislocation density less than 6 cm$^{-2}$, on an IV substrate, in particular a silicon or germanium substrate, including the following steps: providing a hydride of a first IV element (A), such as $Ge_2H_6$ or $Si_2H_6$; providing a halide of a second IV element (B), such as $SnCl_4$; heating the substrate to a substrate temperature that is less than the decomposition
(Continued)

temperature of the pure hydride or of a radical formed therefrom and is sufficiently high that atoms of the first element (A) and of the second element (B) are integrated into the surface in crystalline order, wherein the substrate temperature lies, in particular, in a range between 300° C. and 475° C.; producing a carrier gas flow of an inert carrier gas, in particular $N_2$, Ar, He, which in particular is not $H_3$; transporting the hydride and the halide and decomposition products arising therefrom to the surface at a total pressure of at most 300 mbar; depositing the IV-IV layer, or a layer sequence consisting of IV-IV layers of the same type, having a thickness of at least 200 nm, wherein the deposited layer is, in particular, a $Si_yGe_{1-x-y}Sn$ layer, with x>0.08 and y≤1.

18 Claims, 5 Drawing Sheets

(51) Int. Cl.
| | | |
|---|---|---|
| *C30B 29/52* | (2006.01) | |
| *C30B 29/10* | (2006.01) | |
| *H01L 21/02* | (2006.01) | |
| *C30B 25/02* | (2006.01) | |
| *C09K 11/66* | (2006.01) | |

(52) U.S. Cl.
CPC .............. *C30B 29/10* (2013.01); *C30B 29/52* (2013.01); *H01L 21/0245* (2013.01); *H01L 21/0262* (2013.01); *H01L 21/02381* (2013.01); *H01L 21/02452* (2013.01); *H01L 21/02505* (2013.01); *H01L 21/02532* (2013.01); *H01L 21/02535* (2013.01)

(58) Field of Classification Search
CPC ........... H01L 21/02505; H01L 21/0262; H01L 21/02452; C30B 25/10; C30B 25/183; C30B 29/52; C30B 29/68; C09K 11/66
See application file for complete search history.

(56) References Cited

U.S. PATENT DOCUMENTS

| | | | | |
|---|---|---|---|---|
| 6,395,248 B1* | 5/2002 | Kim | ...................... | C01B 33/035 |
| | | | | 423/349 |
| 2007/0161216 A1* | 7/2007 | Bauer | ............... | H01L 21/02529 |
| | | | | 438/503 |
| 2010/0273318 A1 | 10/2010 | Melnik et al. | | |
| 2013/0045548 A1 | 2/2013 | Kappeler et al. | | |
| 2013/0280891 A1 | 10/2013 | Kim et al. | | |
| 2014/0020619 A1 | 1/2014 | Vincent et al. | | |
| 2015/0087110 A1* | 3/2015 | Facchetti | .......... | H01L 21/02422 |
| | | | | 438/104 |

OTHER PUBLICATIONS

International Search Report Application No. PCT/EP2015/060881 Completed: Jul. 29, 2015; dated Aug. 5, 2016 7 pages (with translation).

Written Opinion of the International Searching Authority Application No. PCT/EP2015/060881 dated Dec. 17, 2015 8 pages.

K. Grüter, et al: "Deposition of High Quality GaAs Films at Fast Rates in the LP-CVD System", Journal of crystal grows 94 (1989), pp. 607-612.

S. Wirths, et al: "Band engineering and growth of tensile strained Ge/ (Si)GeSn heterostructures for tunnel field effect transistors" (Applied Physics Letters 102, 192103 (2013)) Published by the American Institute of Physics.

S. Wirths, et al: "Epitaxial Growth of Ge1-xSnx by Reduced Pressure CVD Using SnC14 and Ge2H6", ECS Transactions, vol. 50, No. 9, Mar. 15, 2013 (Mar. 15, 2013), pp. 885-893.

S. Wirths, et al: "Low temperature RPCVD epitaxial growth of Si1-xGex using Si2H6 and Ge2H6" (Solid-State Electronics vol. 83 (2013) 2-9).

S. Wirths, et al: "Reduced Pressure CVD Growth of Ge and Ge1-xSnx Alloys", ECS Journal of Solid State Science and Technology, vol. 2, No. 5, Mar. 5, 2013 (Mar. 5, 2013), pp. N99-N102.

S. Wirths, et al: "SiGeSn growth studies using reduced pressure chemical vapor deposition towards optoelectronic applications", Thin Solid Films, vol. 557, Apr. 1, 2014 (Apr. 1, 2015), pp. 183-187.

S. Wirths, et al: "Tensely strained GeSn alloys as optical gain media" (Applied Physics Letters 103, 192110 (2013).

Al-Kabi, Sattar, et al., "An optically pumped 2.5 µm GeSn laser on Si operating at 110K", Appl. Phys. Lett.109, 171105 (published Oct. 26, 2016), AIP Publishing, American Institute of Physics, https://doi.org/10.1063/1.4966141, 5 pages.

Reboud, V., et al., "Optically pumped GeSn micro-disks with 16% Sn lasing at 3.1 µm up to 180 K", Appl. Phys. Lett.111, 092101 (published Aug. 28, 2017), AIP Publishing, American Institute of Physics, https://doi.org/10.1063/1.5000353, 5 pages.

* cited by examiner

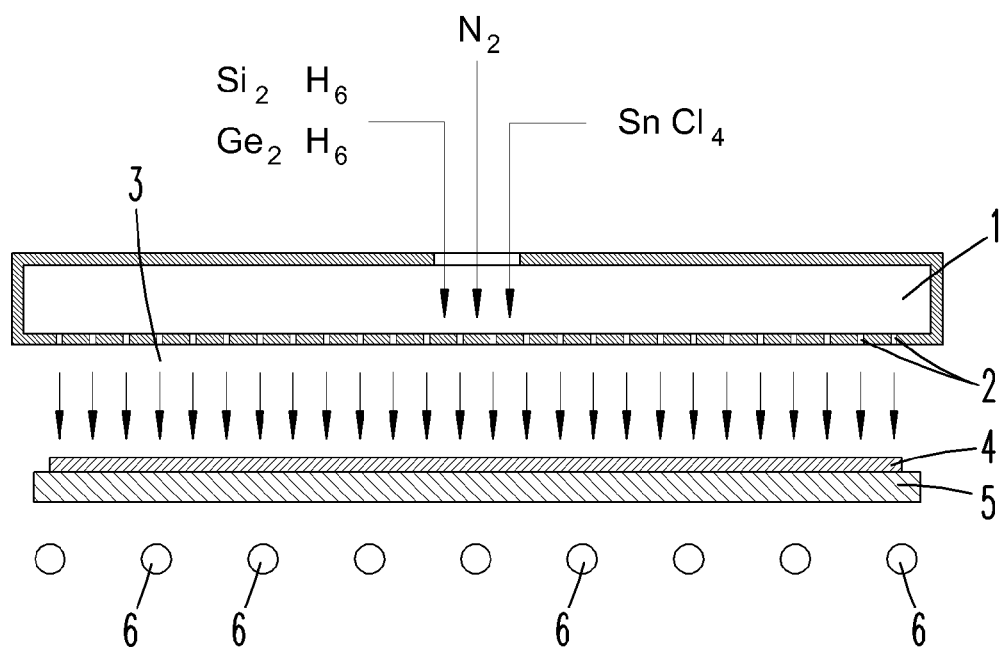

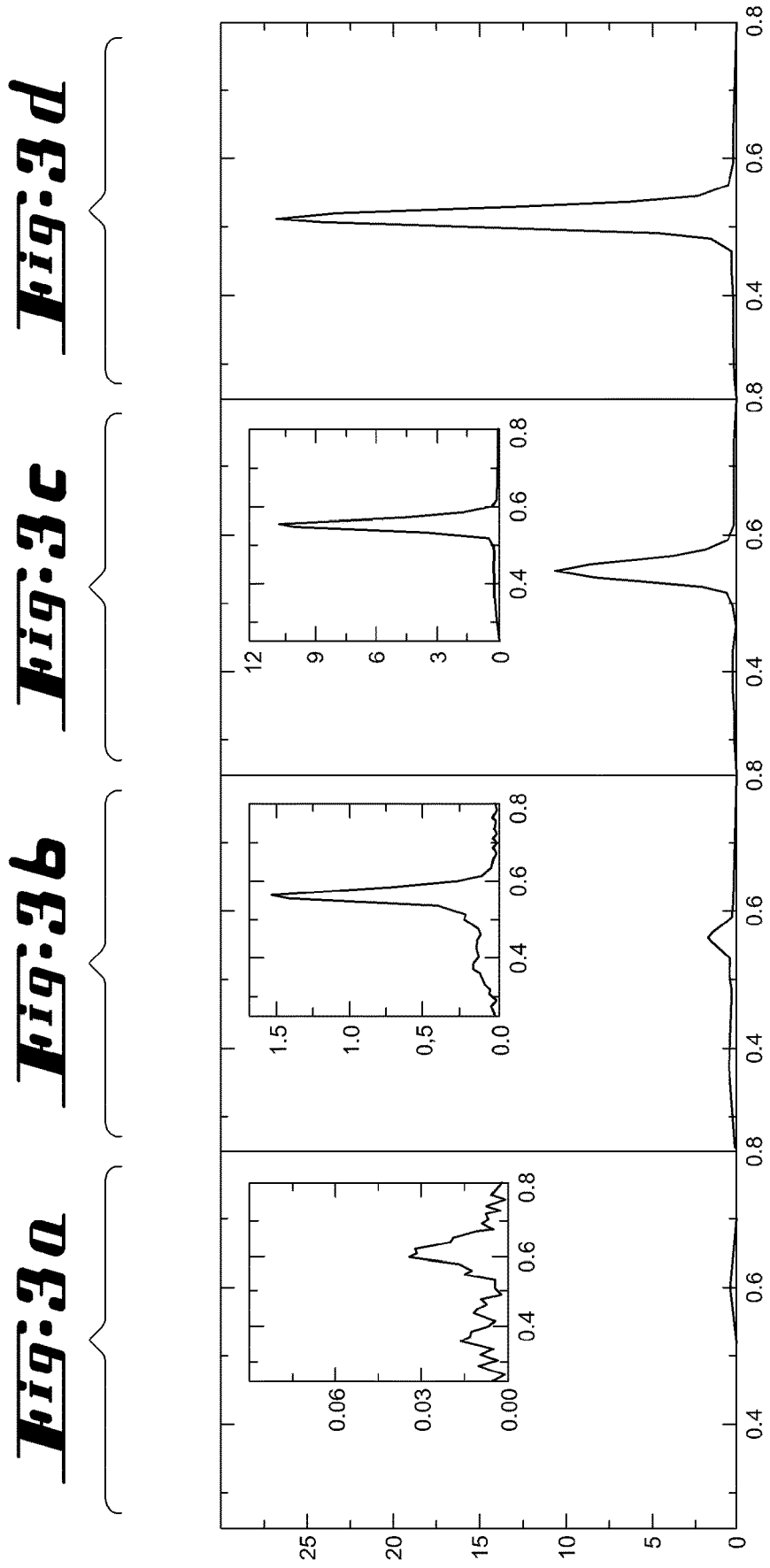

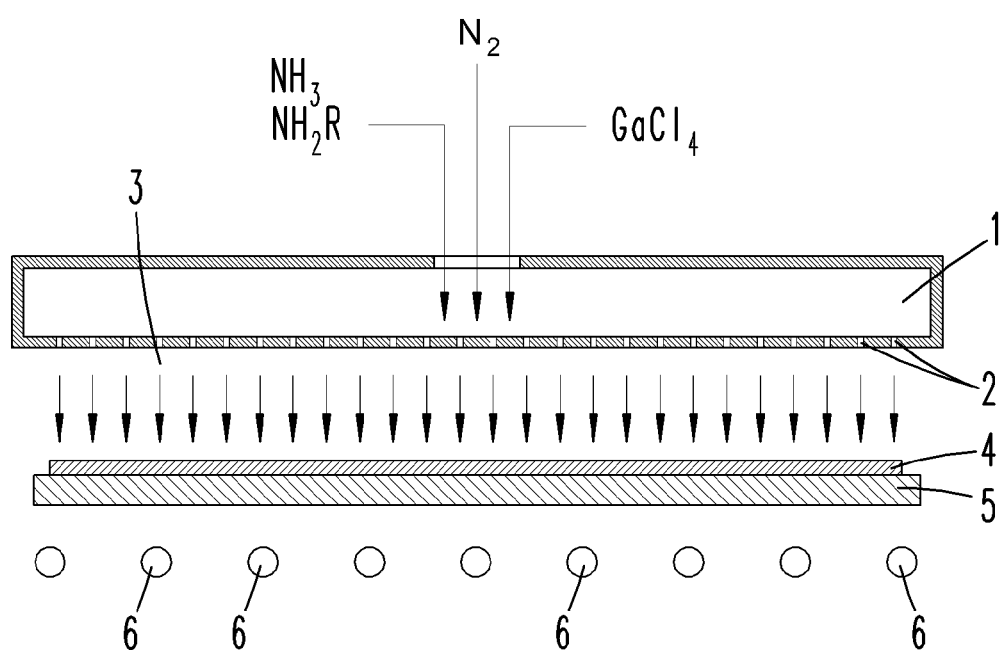

METHOD FOR DEPOSITING A CRYSTAL LAYER AT LOW TEMPERATURES, IN PARTICULAR A PHOTOLUMINESCENT IV-IV LAYER ON AN IV SUBSTRATE, AND AN OPTOELECTRONIC COMPONENT HAVING SUCH A LAYER

TECHNICAL FIELD

The invention relates to a method for depositing an in particular binary, ternary, or quaternary semiconductor crystal, which glows as a result of a direct electronic band transfer when excited, for example by application of a voltage by coupling in light in the visible, infrared, or ultraviolet range. The invention additionally relates to an optoelectronic component which has a layer consisting of a crystal of this type, and also to an integrated circuit which comprises a component of this type. The invention additionally relates to the deposition of a crystal layer of a crystal at low temperatures, in particular beyond its thermodynamic equilibrium.

BACKGROUND

The deposition of gallium arsenide layers is already known from "DEPOSITION OF HIGH QUALITY GaAs FILMS AT FAST RATES IN THE LP-CVD SYSTEM", Journal of crystal grows 94 (1989) 607-612". Gallium is introduced in the form of a chloride into a process chamber, and arsenic is introduced in the form of a hydride. The growth rate reduces with decreasing temperature and with decreasing total pressure. The dependency of the growth rate on the total pressure has a minimum at approximately 100 mbar and rises by more than a factor of 10 at lower total pressures up to 10 mbar.

The majority of semiconductor components used in the industry and in particular integrated circuits, in particular logic circuits or circuits used in microprocessors, are produced using silicon technology. A silicon substrate on which doped or undoped silicon layers or silicon oxide layers are deposited is used. In spite of the different lattice constants, it is also possible to deposit other IV-IV alloys in a crystalline manner on a silicon crystal, for example germanium or germanium tin. A technical disadvantage of previously produced IV-IV crystals is the absence of a direct electronic band transfer. Both silicon and germanium, but also thermodynamically stable germanium tin or silicon have no direct band transfer suitable for the manufacture of optically activatable components, for example LEDs or lasers.

It is assumed that an unstrained germanium tin alloy as crystal could have a direct band transfer outside the thermodynamic equilibrium, specifically at tin concentrations of at least approximately 20%. The equilibrium tin concentration in a germanium tin alloy, however, is less than 1%. It is assumed that an increase in the tin concentration with formation of a thermodynamically metastable crystal would lead to a reduction of the conduction band in the region of the $\lceil$ valley which is greater than the reduction of the conduction band in the $\lfloor$ valley. In the $\lceil$ valley a direct band transfer would then form, which would provide the crystal with the desired optical properties.

The deposition of germanium tin layers or silicon germanium tin layers on silicon substrates or on germanium buffer layers is described in "SiGeSn growth studies using reduced pressure chemical vapor deposition towards optoelectronic applications" in Thin Solid Films 2013 (S. Wirths, et al., Thin Solid Films (2013), http://dx.doi.Org/10.1016/j.tsf.2013.10.078)". The 45 nm or 65/100 nm thick layers deposited there having an Sn proportion of at most 11% did not demonstrate any luminescence. A pseudomorphous growth was found. The experiments described there were carried out at substrate temperatures between 350° C. and 475° C. $Si_2H_6$ (60 Pa), $Ge_2H_6$ (120 Pa) and $ScCl_4$ (0.6 Pa) were used as process gases.

The experimental construction of a CVD reactor with which germanium layers can be deposited on silicon substrates and germanium tin layers can be deposited on silicon substrates is described in "Reduced Pressure CVD Growth of Ge and Gei-xSnxAlloys" (ESC Journal of Solid State Science and Technology, 2(5) N99-N102 (2013))".

The following publications also belong to the prior art and describe the deposition of non-luminescent GeSn layers:

"Band engineering and growth of tensile strained Ge/(Si) GeSn heterostructures for tunnel field effect transistors" (Applied Physics Letters 102, 192103 (2013)), "Tensely strained GeSn alloys as optical gain media" (Applied Physics Letters 103, 192110 (2013)), "Low temperature RPCVD epitaxial growth of Sii-xGex-using Si2H6 and Ge2H6" (Solid-State Electronics 83 (2013) 2-9), "Epitaxial Growth of Gei-xSnxby Reduced Pressure CVD Using SnCk and Ge2H6" (ECS Transactins, 50 (9) 885-893 (2012) © The Electrochemical Society).

A device for depositing layers or layer sequences containing silicon and germanium is described in DE 10 2004 034 103 A1. The use of radicals in a CVD process is already known from U.S. Pat. No. 6,200,893.

SUMMARY

The object of the invention is to deposit crystals at low temperatures, in particular outside their thermodynamic equilibrium, in particular to deposit optically active or activatable IV semiconductor layers, in order to enable the monolithic integration of optically active components on silicon substrates.

The object is achieved by the invention specified in the claims.

The first aspect of the invention relates to a method for depositing a crystalline semiconductor layer. The semiconductor layer will consist of at least of one or more elements. The one or more elements will be fed as constituents of gaseous starting materials together with an inert carrier gas into a process chamber of a CVD reactor. The first gaseous starting material can be a hydride, for example $CH_3$, $SiH_4$, $Si_2H_6$, $AsH_3$, $PH_3$ or $NH_3$. The second gaseous starting material can be a chloride, for example $SiCl_4$, $GeCl_4$, $CCl_4$, $SnCl_4$, $GaCl_4$, $InCl_4$ or $AlCl_4$. The carrier gas can be $N_2$, Ar, He, but should not be $H_2$. The device for carrying out the method preferably has a gas inlet member, for example in the form of a showerhead. This has one or more gas distribution chambers, which each have a multiplicity of gas outlet openings, which open out into a process chamber. The process gases can flow into the process chamber through the gas outlet openings. The gas inlet member is cooled in order to avoid a premature decomposition there of the starting materials. The deposition process is carried out in the low-pressure range, i.e. at pressures lower than 300 mbar, lower than 200 mbar, lower than 100 mbar, or more preferably at 60 mbar. Radicals are produced from the first starting material. This can occur in the way described in the literature, for example by a plasma, a hot wire, or high-frequency activation. However, the radicals are preferably produced in that the first process gas is expanded at the entry into the gas inlet member or into the process chamber from a high pressure, which is above the atmospheric pressure, to a low pressure, wherein the low pressure corresponds to the total pressure in the process chamber, which is less than 300 mbar. By way of example, $Ge_2H_6$ or $Si_2H_6$ can decompose into germanium or silane radicals ($GeH_3*$ or $SiH_3*$). Due to the low partial pressure in the process chamber, the reverse reaction rate reduces, such that the carrier gas fed into the process chamber transports radicals to the surface of a semiconductor substrate heated to a substrate temperature. Since no $H_2$ or only a minimum of $H_2$ is present in the gas phase, the necessary reaction parameter for forming $GeH_4$ or $SiH_4$ is missing. Highly diluted radicals are thus created in the gas phase. The substrate temperature is lower than the decomposition temperature of the pure radical. As a result, only an extremely small growth of 1 nm/h and less would take place without the admixture of chloride. In accordance with the invention, however, the chloride is transported together with the radicals to the substrate surface. There, a first reaction takes place between the radicals and the chlorides. In the case of this exothermic reaction, reaction heat is released, which leads to a local temperature increase at the surface of the layer or substrate. There, where the first reaction takes place, the surface thus has a temperature which is sufficient to decompose the first starting material and in particular the radical dissociated therefrom. In the first reaction a gaseous reaction product is formed, which is carried away with the carrier gas. The first and second elements remain at the surface as non-gaseous reaction product. In the case of the second reaction, which is initiated by the reaction heat of the first reaction, the radical decomposes into a volatile reaction product, which is transported away with the carrier gas, and into the first element. As a result of both reactions, which take place simultaneously, atoms of the first element and second element are adsorbed at the substrate surface. The substrate lies on a susceptor, which is heated from below, for example by a lamp heater. This is distanced from the gas outlet surface of the showerhead by approximately 1 to 2 cm. The substrate temperature is below the aforementioned upper limit value, such that the pure hydride or the pure radical cannot decompose at the surface, but is only decomposed into its constituents by the aforementioned chain reaction. The substrate temperature is sufficiently high (it lies preferably in the range between 300° C. and 450° C.) to ensure a surface movability of the non-volatile reaction products resulting from the two chemical reactions. The reaction heat of the first reaction between the radicals and the halides makes a significant contribution to the increase of the surface mobility. The atoms of the one or more elements adsorbed at the surface can thus move to a small extent over the surface for a short time and over a short distance in order to find places for integration into the crystal lattice that are favourable in terms of energy. The local surface temperature is so high that the atoms of the first element and of the second element are integrated into the surface in crystalline order. Since the surface of the layer is warmer than the substrate, i.e. the surface has a temperature higher than the substrate temperature, a surface roughness otherwise occurring at the substrate temperature is eliminated. There is no amorphisation. In the experiment reported in the literature cited in the introduction, thin SiGeSn layers were deposited on Ge layers. Relatively thin (45 nm and 85 nm thick) layers were deposited on silicon substrates and germanium pseudo substrates respectively, under the process conditions there. Due to the relatively large difference between the crystal lattice constants of a GeSn crystal and a Ge crystal, a tetragonal distortion of the crystal of the grown material occurs with the deposition. The planar lattice constant perpendicularly to the growth direction matches the cubic lattice constant of the substrate. The perpendicular lattice constant, which extends parallel to the growth direction, increases. In the previous experiments mentioned in the introduction, a surface that becomes rougher with increasing layer thickness was observed. The formation of lattice mismatch dislocations at the boundary to the Si substrate used there was observed, as was a high density of thread dislocations, which are drawn through the entire 85 nm layer to the surface. At the low growth temperatures used for the GeSn growth, the surface mobility of the molecules of the gaseous starting materials or decomposition products thereof adsorbed at the surface is heavily reduced, which leads to a great roughness and ultimately to the observed amorphisation. It has surprisingly been found that with the aid of the radical-assisted growth method according to the invention, the otherwise expected "epitaxial breakdown" is absent, in particular with use of a Ge buffer layer. With layer thicknesses above a critical layer thickness, a relaxation of the layer starts, which can grow to 80% or more and preferably grows above 80%. The density of thread dislocations reduces to values of less than $10^6$ cm$^{-2}$ or less than $10^5$ cm$^{-2}$. The lattice mismatch dislocations are localised to a small region (10 nm to 20 nm) close to the boundary. The otherwise expected thread dislocations or screw dislocations could not be determined. Significant lattice mismatch dislocations were observed only in the region up to 10 nm to 20 nm away from the boundary, wherein dislocations in the Ge buffer layer were also observed directly adjacent to the boundary layer. The relaxation mechanism was observed in particular in layers having a layer thickness of 200 nm which were deposited on a Ge buffer layer having few defects, wherein the Ge buffer layer had been deposited on a Si(001) substrate. Both the deposition of the buffer layer and the deposition of the IV-IV layer can take place in an overall process in successive process steps in a process chamber of a CVD reactor without the process chamber being opened in between. A layer growth of at least 200 nm, preferably of at least 300 nm, is key. The method according to the invention uses the reaction heat of a reactive gas source (radicals) in order to locally heat the layer surface. Crystal growth takes place in the non-equilibrium state. The non-equilibrium state is frozen to a certain extent, since the local heat generated by the chemical reaction is carried away in the crystal within a short space of time as a result of a high temperature gradient. One of the above-mentioned hydrides of the V main group can be used as first gaseous starting material. One of the above-mentioned halides of the III main group is preferably used as second gaseous starting material. Provision is also made so that hydrides of the elements of the VI main group and halides, in particular chlorides, of the elements of the II main group can be used. However, the method is particularly preferably used to deposit IV-IV layers on IV-IV substrates. The two gaseous starting materials preferably contain two different elements, for example Ge and Sn. $Si_2H_6$, possibly also $SiH_4$ or $Ge_2H_6$, possibly also $GeH_4$ is then used as first gaseous starting material. A halide of an element of the IV main group is used as second starting material, for example a bromide, an iodide, or a chloride. $SnCl_4$ is preferably used. $SnCl_4$ and $Ge_2H_6$ or $Si_2H_6$ are introduced into a process chamber through a cooled gas inlet member. The total pressure in the process chamber has a value at which $Ge_2H_6$, but preferably also $Si_2H_6$ is decomposed primarily into radicals. These radicals are transported together with the chloride by means of an inert carrier gas, in particular $N_2$, preferably not $H_2$, to the substrate surface. The molecules are adsorbed at the surface. An exothermic surface reaction takes place between the radical and the chloride, wherein HCl and energy are released. The energy activates further decompositions of the radical and a local heating of the surface, such that the Ge atoms and Sn atoms have a sufficient surface mobility to be integrated in a monocrystalline manner into the crystal. It has been observed that even with an Sn proportion of more than 8%, photoluminescent layers are produced when the precondition for forming radicals is present and a layer thickness above a critical thickness is deposited. The change to the band transfer from an indirect band transfer to a direct band transfer occurs with an Sn proportion in Ge or SiGe, depending on the strain, of more than 8%, in particular of more than 10%. The maximum necessary Sn proportion for un-strained GeSn is 14% or 20%. The hydride, in particular the $Ge_2H_6$, has a partial pressure in the process chamber in the range between 60 Pa and 120 Pa. The halide, in particular the $SnCl_4$, is fed into the process chamber with such a flow that the partial pressure lies approximately between 0.1% and 5% of the partial pressure of the hydride, in particular in the range between 0.03 Pa and 1.25 Pa. The optically active layer is deposited preferably on a relaxed Ge buffer layer. With growth rates between 10 nm/min and 50 nm/min. The two gaseous starting materials, however, can also contain these elements, for example C, Si, Ge. A first gaseous starting material can thus be a hydrocarbon, a silicon hydrogen, or a germanium hydrogen. The second gaseous starting material can be a carbon chloride, a silicon chloride, or a germanium chloride. A $CH_3$ radical can react in this variant of the invention for example with $CCl_4$ at the surface of the substrate and can form a diamond layer. Element semiconductors, for example silicon semiconductors or germanium semiconductors, can thus be deposited at low temperatures.

The invention additionally relates to a component having a layer structure comprising a layer deposited by means of the above-mention method, in particular a GeSn or SiGeSn layer. The Sn proportion is at least 8%, preferably at least 10%, or lies in a range of from 8% to 20%, preferably 10% to 14%. The layer thickness is greater than 200 nm, preferably greater than 300 nm. The dislocation density within the layer volume, i.e. outside a region disposed 10 nm to 20 nm away from the boundary to the buffer layer, is less than $10^6$ $cm^{-2}$ or $10^{-5}$ $cm^{-2}$. Merely in the region directly bordering the buffer layer does the layer have a higher dislocation density. In the region 10 nm to 20 nm away from the boundary, stepped dislocations in particular can be found, but screw-like dislocations or thread-like dislocations can be found only to a small extent. The layer has a direct band transfer with an energy of approximately 450 meV and is capable of photoluminescence after optical or electrical excitation.

The invention additionally relates to an integrated circuit, in particular MOS circuits, having monolithically constructed integrated circuitry, wherein an Si substrate in particular is used as substrate. In accordance with the invention, a GeSn layer sequence or a layer sequence containing GeSn is applied to the substrate or to a buffer layer applied to the substrate, wherein provision is made in particular so that the layer sequence comprises a GeSn layer arranged between two SiGeSn layers. An integrated circuit of this type has a multiplicity of known components, for example transistors, capacitors, and electrically conductive layers and electrically insulating layers. In accordance with the invention, the integrated circuit has being supplemented by optically active components, which are monolithically deposited on the same substrate, such that not only current, but also light can be used in an integrated circuit of this type for distributing information.

The invention additionally relates to a method for depositing a monocrystalline layer that glows when excited and that is composed of elements of the III and V main group. A III-V layer, in particular GaN layer, is deposited on a substrate, for example a sapphire substrate, a silicon substrate, or a III-V substrate. The layer can have a dislocation density $<10^6$ $cm^{-2}$. The method is carried out similarly to the above-specified method steps with regard to the deposition of a IV-IV layer. A hydride of the fifth main group element is firstly provided, which hydride can be $NH_3$ or $NH_2R$, wherein R is an organic group, for example $C_4H_9$ (tertiary butylate). A halide of a II main group element is provided, for example $GaCl_3$. The substrate is heated to a substrate temperature that is lower than the decomposition temperature of the compounds referred to beforehand as hydrides, which comprise an element of the V main group. The substrate temperature is additionally also lower than the decomposition of a radical formed from this hydride, but is high enough for atoms of the III main group element and of the V main group element to be integrated in crystalline order into the surface of a forming layer, wherein the substrate temperature in particular lies in a range between 300° C. and 475° C. A carrier gas flow of an inert carrier gas is produced and can be $N_2$, Ar, He, but not $H_2$. The hydride and the halide and decomposition products arising therefrom are transported to the surface of the substrate. This occurs preferably at a total pressure of at most 300 mbar. A III-V layer is deposited, or a layer sequence consisting of identical layers. The layer thickness should be at least 200 nm. The method is carried out in such a way that radicals form from the hydride. With use of $NH_3$, this can occur for example by cleaving into $NH_2$ and H. With use of $NH_2R$, this can occur by the separation of the organic group R. The radicals thus formed react in a first reaction exothermically with the halide of the III main group element at the surface. An atom of the V main group and an atom of the element of the III main group are created as reaction product. The atoms remain at the surface. In a second reaction the radicals react simultaneously to the first reaction by endothermically absorbing the heat released during the first reaction.

BRIEF DESCRIPTION OF THE DRAWINGS

Details of the invention will be explained hereinafter on the basis of the accompanying drawings, in which:

FIG. 1 shows the cross-section through a CVD reactor as can be used to deposit the layers;

FIG. 3a shows the photoluminescence spectrum of a GeSn semiconductor layer with an Sn proportion of 8%;

FIG. 3b shows the photoluminescence spectrum of a GeSn semiconductor layer with an Sn proportion of 9.6%;

FIG. 3c shows the photoluminescence spectrum of a GeSn semiconductor layer with an Sn proportion of 11%;

FIG. 3d shows the photoluminescence spectrum of a GeSn semiconductor layer with an Sn proportion of 12.6%;

FIG. 5 shows an illustration according to FIG. 1 relating to the deposition of GaN.

DETAILED DESCRIPTION

Figure 2A:
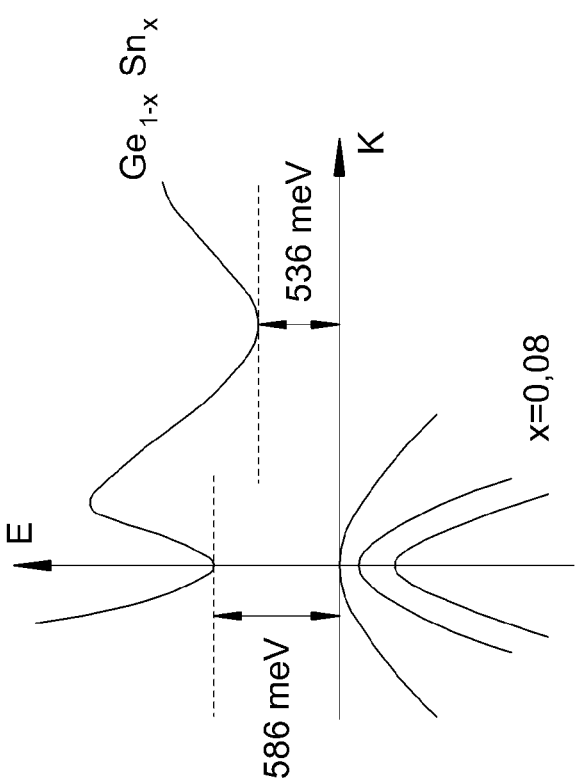
FIG. 2a shows the electrical band structure of a GeSn semiconductor with an Sn proportion of 8%.

FIG. 1 shows, largely schematically, the cross-section through a CVD reactor as is used to carry out the method or to deposit the layers of the components according to the invention. What is not illustrated is an external gas supply for providing the process gases, specifically $Si_2H_6$ and $Ge_2H_6$ and also $SnCl_4$ and, as inert gas, $N_2$. The reactor has a housing which is closed in a gastight manner outwardly and of which the interior can be evacuated by means of a vacuum arrangement or can be regulated to a total pressure in the range from 0 mbar to 1,000 mbar. A gas inlet member 1 in the form of a showerhead is disposed inside the reactor housing. Here, the interior is a gas distribution chamber, to which the process gases and the inert gas are fed. FIG. 1 shows a gas inlet member 1 having just one gas distribution volume. However, provision is also made so that the three process gases are introduced separately from one another into a process chamber 3 arranged below the gas inlet member 1, in each case through a gas distribution chamber. This occurs through gas outlet openings 2 in a gas outlet surface of the gas inlet member 1.

The base of the process chamber 3 is formed by a graphite susceptor 5, which is distanced from the gas outlet surface by approximately 1 cm to 2 cm. One or more Si substrates 4 are disposed on the susceptor 5.

A heater 6 is disposed below the susceptor 5, for example a lamp heater, in order to heat the susceptor 5 to a process temperature of, for example, 300° C. to 400° C.

Four experiments will be explained by way of example in order to explain the essence of the invention. The growth temperature of the four layers A, B, C, D can be inferred from the table below.

ments, wherein the Sn proportion was 8%, 9.6%, 11.1% and 12.6%. The deposition was performed at different temperatures, wherein the growth temperature had an influence on the Sn integration. The growth rates varied between 17 nm/min and 49 nm/min. Layers were deposited in a thickness of approximately 200 nm.

Figure 2B:
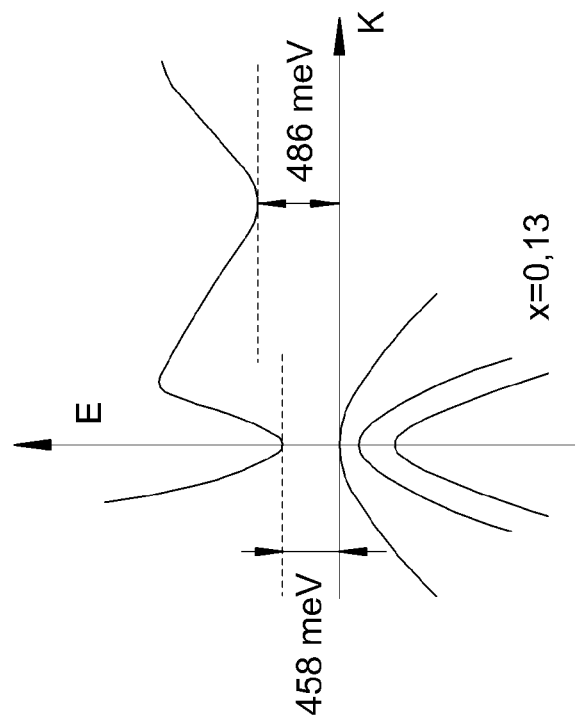
FIG. 2b shows the electrical band structure of a GeSn semiconductor with an Sn proportion of 13%.

FIGS. 2a and 2b show the band structure of a $Ge_{1-x}Sn_x$ crystal, wherein FIG. 2a shows the band structure of a crystal with an Sn proportion of 8% and FIG. 2b shows the band structure with an Sn proportion of 13%. FIG. 2a shows that the direct band gap (Γ valley) has a greater energy than the indirect band gap (L valley). With increasing rise of the Sn proportion, both the indirect band gap (L valley) and the direct band gap (Γ valley) are displaced, wherein the energy of the band gap of the direct band transfer decreases more significantly, such that the band transfer changes from indirect to direct in a region between 8% Sn proportion and 13% Sn proportion. Since the band structure is not only dependent on the Sn proportion, but also on the lattice strains, a critical Sn proportion cannot be specified.

FIGS. 3a to 3d show the photoluminescence spectrum of layers having different Sn proportions. It can be seen that the layer A with an Sn proportion of 8% has only a low photoluminescence, the layer B with an Sn proportion of 9.6% already has an identifiable photoluminescence, the layer C with an Sn proportion of 11.1% has significant photoluminescence, and the layer D with an Sn proportion of 12.6% has a strong photoluminescence, in each case at 20° K.

Figure 4:
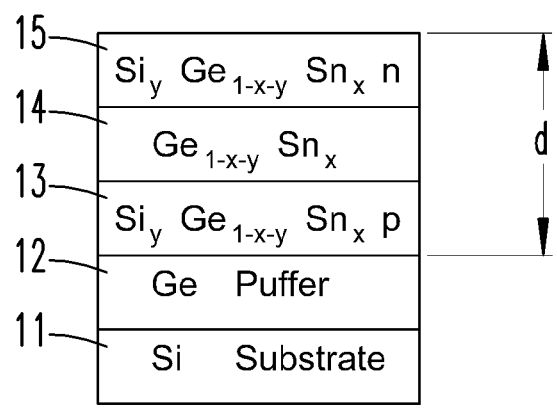
FIG. 4 shows the example of a layer sequence according to the invention.

FIG. 4 shows the example of a light-emitting layer structure consisting of a layer sequence 13, 14, 15 with a layer thickness of at least 200 nm. From the layer sequence illustrated in FIG. 4, it is possible for example to produce a laser component which can be integrated monolithically into a circuit which has been applied monolithically to a silicon

|   | x_Sn (at. %) | Total flow (sccm) | Reactor pressure (mbar) | Temperature (° C.) | $Ge_2H_6$ flow (sccm) | $SnCl_4$ flow (sccm) | $SnCl_4$ bubbler temperature (° C.) | Growth time (min) | Steam pressure $SnCl_4$ (mbar) |
|---|---|---|---|---|---|---|---|---|---|
| A | 8 | 2000 | 60 | 390 | 400 | 25 | 20 | 3.75 | 25 |
| B | 9.6 | 2000 | 60 | 375 | 400 | 25 | 20 | 4.83 | 25 |
| C | 11.1 | 2000 | 60 | 375 | 400 | 25 | 20 | 6 | 25 |
| D | 12.6 | 2000 | 60 | 350 | 400 | 12 | 20 | 13.33 | 25 |

$N_2$ was used as carrier gas. The $SnCl_4$ bubbler, however, was operated with $H_2$ as carrier gas so as to conduct gaseous $SnCl_4$ into the reactor. The layers A and C were seemingly produced with the same growth parameters. However, it should be taken into consideration here that on account of a drift in the CVD system, in particular in the $SnCl_4$ source, the actual $SnCl_4$ flows were different. The dilution ratio of $SnCl_4$ in the $H_2$ carrier gas flow through the bubbler was approximately 10% and was subject to a drift, which in particular was dependent on the fill level of the liquid starting material in the source container.

A Ge buffer layer was first deposited on an Si(001) substrate. The Ge buffer layer had a high-quality surface. It was a Ge buffer layer having few defects and having a surface roughness in the region of 0.25 nm. The Ge buffer layer was deposited by introducing $Ge_2H_6$ into the process chamber.

With a $Ge_2H_6$ flow of 400 sccm and a total flow of 2,000 sccm at a total pressure of 60 mbar, layers of $Ge_{1-x}Sn_x$ were deposited onto the Ge buffer layer in four different experisubstrate 11. A Ge buffer layer 12 is first deposited on a silicon substrate 11. The first layer SiGeSn 13 of the layer sequence, which is p-doped, is then deposited on the Ge buffer layer 12. An active GeSn layer 14 is deposited thereon. An n-doped SiGeSn layer 15 is lastly deposited on the active layer 14. The Sn proportion (x value) lies in the range between 0.1 and 0.14. The Si proportion (y value) lies in the range between 0 and 0.2.

In the method, $Ge_2H_6$ is fed from a storage container at a pressure of more than 1,000 mbar together with $N_2$ into the gas inlet member 1. $Ge_2H_6$ and Ge $H_3$* are in thermodynamic equilibrium in accordance with the following equilibrium reaction.

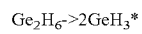

Whereas, in the storage container, the left side of the equilibrium reaction dominates, the method is carried out so that the right side of the equilibrium reaction dominates in the process chamber. The decomposition of $G_2H_6$ into GeH$_3$* is achieved on account of a pneumatic expansion of the gas from a pressure above atmospheric pressure to a sub-atmospheric pressure. In the exemplary embodiment the expansion occurs after 60 mbar.

Furthermore, $SnCl_4$ is introduced into the process chamber, With $N_2$ as carrier gas, $SnCl_4$ and $GeH_3^*$ are conveyed to the surface of the substrate 4, which lies on the heated susceptor 5 and has a surface temperature between 350° C. and 390° C. $SnCl_4$ and $GeH_3^*$ are adsorbed at the surface and react there exothermically with one another, $$4GeH_3^* + 3SnCl_4 \rightarrow 4Ge + 3Sn + 12HCl + energy$$

The HCl arising during this reaction is conveyed from the process chamber 3 by the carrier gas. The energy released leads to a local heating of the surface. The Ge atoms and Sn atoms remain adsorbed at the surface.

As a result of the local increase in the temperature of the surface, the following endothermic decomposition reactions take place.

$$2GeH_3^* + energy \rightarrow 2Ge + 3H_2$$

In parallel, the following decomposition reaction of undissociated $Ge_2H_6$ can also take place.

$$Ge_2H_6 + energy \rightarrow 2Ge + 3H_2$$

The hydrogen arising as a result is transported away by the carrier gas. The surface is heated locally to such a temperature that the Ge atoms and Sn atoms have a sufficient surface mobility to form a crystal in a monocrystalline manner. At the process temperature (350° C. to 390° C.), the crystal thus deposited has a crystal structure which lies far beyond the thermodynamic equilibrium (instead of an Sn proportion of at most 1%, the Sn proportion can be up to 20%).

If an Si component is additionally also introduced into the process chamber, this occurs with use of $Si_2H_6$ as starting material, which is decomposed into adsorbed Si atoms similarly to the above-described mechanism.

Layers having the following composition are deposited $$Si_yGe_{1-x-y}Sn_x$$

$$0.008 \leq x \leq 0.14$$

$$0 \leq y \leq 0.2$$

The layer 14 or layer sequence 13, 14, 15 should have a minimum thickness d of at least 200 nm, preferably at least 300 nm in accordance with the invention. With a layer thickness of this type, which is deposited with growth rates of from 15 nm/min to 50 nm/min, the dislocation density in the layer volume, i.e. above a boundary region to the buffer layer 12 having a thickness of from 10 nm to 20 nm, is at most $10^5$ cm$^{-2}$ to $10^6$ cm$^{-2}$. In the boundary region, i.e. in the first 10 nm to 20 nm of the layer or layer sequence, the dislocation density can assume much higher values. However, screw-like or thread-like dislocations there have a maximum density of $5 \times 10^6$ cm$^{-2}$.

In a variant of the invention an element semiconductor, for example a diamond layer, a silicon layer, or a germanium layer is deposited by low-temperature epitaxy. In order to deposit a diamond layer, $CH_3^*$ reacts with $CCl_4$ to form diamond. In order to deposit a silicon layer, $SiH_3^*$ reacts with $SiCl_4$ to form silicon, and in order to deposit a germanium layer $GeH_3^*$ reacts with $GeCl_4$ to form germanium.

With reference to FIG. 5, a further exemplary embodiment will be described hereinafter, in which $NH_3$ is fed from a storage container at a pressure of more than 1,000 mbar together with $NH_2$ into a gas inlet member 1. Radicals $NH_2^*$ are produced thermally, but also with other suitable means, for example a plasma generator or other type of energy feed, in accordance with the following reaction $$NH_3 \rightarrow NH_2^* + H$$

In addition, $GaCl_3$ is fed into the process chamber through the gas inlet member 1.

In a variant of the method, $NH_2R$ is fed into the process chamber instead of $NH_3$, since this process gas can be brought into the form of the radical $NH_2^*$ with less energy. Here, R is an organic group, for example $C_4H_9$.

$$NH_2R \rightarrow NH_2^* + R$$

In a first reaction, the $NH_2^*$ reacts exothermically with gallium chloride in accordance with the following reaction equation $$3NH_2^* + 2GaCl_3 \rightarrow 3N + 2Ga + 6HCl + energy$$

The energy released during this reaction drives the parallel reaction specified as follows $$NH_2^* + energy \rightarrow N + H_2,$$

in which elemental nitrogen arises. The elemental gallium formed during the first exothermic reaction and the elemental nitrogen formed during the second endothermic reaction are disposed at the surface. The individual atoms can find the integration places in the layer that are most favourable in terms of energy, such that an epitaxial monocrystalline GaN layer is produced. The layer can be deposited on a sapphire substrate, a silicon substrate, or a III-V substrate.

In accordance with the invention, the radicals produced in the gas phase reaction reach the surface and only react with one another there.

The above embodiments serve to explain the inventions included on the whole by the application which, each independently, develop the prior art at least by the following combinations of features:

A method for depositing a monocrystalline semiconductor layer consisting of a first element A and a second element B, wherein the first element A is fed as part of a first gaseous starting material, in particular a hydride, and the second element B is fed as part of a second gaseous starting material, in particular a halide, together with a carrier gas formed by an inert gas, in particular $N_2$, Ar, He, into a process chamber 3 of a CVD reactor, wherein radicals are produced from the first starting material, which radicals and the second starting material are brought to the surface of a semiconductor substrate heated to a substrate temperature which is lower than the decomposition temperature of the pure radical, wherein the radicals in a first reaction react exothermically with the second starting material, in particular the halide, at the surface, wherein atoms of the first element A and atoms of the second element B remain at the surface as reaction products and the radicals decompose endothermically in a second reaction, at the same time as the first reaction, by absorbing the heat released during the first reaction, wherein atoms of the first element A remain at the surface, wherein the substrate temperature is sufficiently high for the atoms of the first element A and of the second element B to be integrated into the surface in crystalline order.

A method which is characterised in that the first element A is an element of the V main group, for example arsenic, phosphorus, antimony or nitrogen, the second element B is an element of the III main group, for example aluminium, gallium or indium, or in that the first element is an element of the IV main group, for example carbon, silicon or germanium, and the second element (B) is an element of the IV main group, for example carbon, silicon, germanium or tin, or in that the first element (A) is an element of the VI main group and the second element (B) is an element of the II main group.

A method characterised in that the radicals are produced by pneumatic expansion of the first gaseous starting material when feeding into the process chamber from a pressure greater than 1,000 mbar to a process chamber pressure of less than 300 mbar.

A method for monolithically depositing a monocrystalline IV-IV layer that glows when excited and that is composed of a plurality of elements of the IV main group, in particular a GeSn or SiGeSn layer, having a dislocation density less than $10^6$ cm$^{-2}$, on an IV substrate, in particular a silicon or germanium substrate, in particular a silicon substrate or germanium substrate, comprising the following steps:
- providing a hydride of a first IV element (A), such as Ge$_2$H$_6$ or Si$_2$H$_6$;
- providing a halide of a second IV element (B), such as SnCl$_4$;
- heating the substrate to a substrate temperature that is less than the decomposition temperature of the pure hydride or of a radical formed therefrom and is sufficiently high that atoms of the first element (A) and of the second element (B) are integrated into the surface in crystalline order, wherein the substrate temperature lies, in particular, in a range between 300° C. and 475° C.;
- producing a carrier gas flow of an inert carrier gas, in particular N$_2$, Ar, He, which in particular is not H$_2$;
- transporting the hydride and the halide and decomposition products arising therefrom to the surface at a total pressure of at most 300 mbar;
- depositing the IV-IV layer, or a layer sequence consisting of IV-IV layers of the same type, having a thickness of at least 200 nm, wherein the deposited layer is, in particular, a Si$_y$Ge$_{1-x-y}$Sn layer, with x>0.08 and y≤1.

A method characterised in that the hydride is Ge$_2$H$_6$ and/or Si$_2$H$_6$ and is fed with a partial pressure of from 60 Pa to 120 Pa into the process chamber.

A method characterised in that the halide is SnCl$_4$ and is fed with a partial pressure of from 0.1% to 5% of the partial pressure of the hydride, in particular with a partial pressure of from 0.03 Pa to 1.25 Pa into the process chamber.

A method characterised in that the layer or the layer sequence is deposited on a Ge buffer layer applied to an Si substrate.

A method characterised in that the substrate temperature lies in a range between 350° C. and 390° C.

A method characterised in that the layer or layer sequence is deposited with a growth rate in the range between 15 nm/min and 50 nm/min.

An optoelectronic component, for example laser, photodiode, photosensor, photoelement, optical waveguide, or the like, having a monocrystalline IV-IV layer that has been epitaxially deposited on an IV substrate, in particular a Ge or Si substrate, glows when excited, is composed of a plurality of elements of the IV main group, in particular a GeSn or SiGeSn layer, and has a dislocation density less than $10^6$ cm$^{-2}$, wherein the layer or a layer sequence comprising the layer and consisting of a plurality of identical IV-IV layers is at least 200 nm thick, preferably at least 300 nm thick.

A method or an optoelectronic component characterised in that the layer is a GeSn layer or an SiGeSn layer and the Sn proportion lies in the range between 8% and 20%, preferably is greater than 10%, and particularly preferably lies in the range between 10% and 14%.

A method or an optoelectronic component characterised in that the layer has a relaxation degree of more than 80% and/or the dislocation density is less than $10^5$ cm$^2$, and/or in that the lattice defects are limited to a region close to the boundary layer to the substrate or the buffer layer, in particular to a region between 10 nm and 20 nm away from the boundary layer.

A method or an optoelectronic component characterised in that the layer sequence is a GeSn layer which is arranged between two SiGeSn layers.

A monolithically applied integrated circuit, in particular a microprocessor, characterised by an optoelectronic component according to any one of claims 10 to 13 monolithically applied to the substrate or a buffer layer.

All of the disclosed features are essential to the invention (individually, but also in combination with one another). The content of the associated/appended priority documents (copy of the prior application) is hereby fully incorporated into the disclosure of the application by reference, in addition for the purpose of including features of these documents in claims of the present application. The features in the dependent claims characterise independent, inventive developments of the prior art, in particular so as to be able to produce divisional applications on the basis of these claims.

The invention claimed is:

1. A method for monolithically depositing a monocrystalline IV-IV layer that glows when excited and that is composed of a plurality of elements of the IV main group, having a dislocation density less than $10^6$ cm$^{-2}$, on a IV substrate, of atoms of the IV main group, comprising the following steps:
- providing a hydride of a first element (A) being C, Si, or Ge, with a structure A$_n$H$_m$, wherein n, m are natural numbers;
- providing a chloride of a second element (B) being C, Si, Ge, or Sn, with a structure B$_k$Cl$_l$, wherein k, l are natural numbers;
- decomposing the hydride such that the hydride produces a radical with a structure A$_n$H$_{m'}$, wherein m' is a natural number less than m;
- heating a susceptor which holds the IV substrate to a susceptor temperature that is between 300° C. and 400° C.;
- producing a carrier gas flow of an inert carrier gas;
- transporting the chloride and the radical of the hydride to a surface of the IV substrate at a total pressure of at most 300 mbar;
- decomposing the first element (A) from the radical of the hydride and decomposing the second element (B) from the chloride, wherein said step of decomposing includes:
  - producing heat from an exothermic reaction between the radical of the hydride and the chloride at the surface of the IV substrate, wherein atoms of the first element (A) and atoms of the second element (B) remain at the surface of the IV substrate as a reaction product, and
  - absorbing the heat at a same time as the exothermic reaction by an endothermic reaction at the surface of the IV substrate, wherein the endothermic reaction is a decomposition reaction of the radical of the hydride, wherein atoms of the first element (A) remain at the surface of the IV substrate; and
- depositing the first element (A) and the second element (B) to form the monocrystalline IV-IV layer on the surface of the IV substrate, the monocrystalline IV-IV layer having a thickness of at least 200 nm, wherein the heat released by the exothermic reaction heats the surface of the monocrystalline IV-IV layer to grow a crystal layer in a non-equilibrium state.

2. The method according to claim 1, wherein the chloride is $SnCl_4$ and is provided with a partial pressure of from 0.1% to 5% of a partial pressure of the hydride.

3. The method according to claim 1, wherein the monocrystalline IV-IV layer is deposited on a Ge buffer layer applied the IV substrate, and wherein the IV substrate is an Si substrate.

4. The method according to claim 1, wherein during the heating step the substrate temperature is heated to a temperature between 350° C. and 390° C.

5. The method according to claim 1, wherein the monocrystalline IV-IV layer is deposited with a growth rate in the range between 15 nm/min and 50 nm/min.

6. The method according to claim 1, wherein the IV substrate is a silicon or germanium substrate.

7. The method according to claim 1, wherein the hydride is $Ge_2H_6$ or $Si_2H_6$.

8. The method according to claim 1, wherein the chloride is $SnCl_4$.

9. The method according to claim 1, wherein the inert carrier gas is $N_2$, Ar, or He.

10. The method according to claim 1, wherein the monocrystalline IV-IV layer comprises GeSn and the hydride comprises $Ge_2H_6$ and the chloride comprises $SnCl_4$ and the radical of the hydride comprises $GeH_3$.

11. The method according to claim 1, wherein a reaction between the chloride and the radical of the hydride further heats the surface of the IV substrate.

12. The method according to claim 1, wherein the step of absorbing the heat creates a temperature gradient in a direction transverse to the surface of the IV substrate.

13. The method according to claim 12, wherein the temperature at the surface of the IV substrate following the exothermic reaction is such that a growth rate of the monocrystalline IV-IV layer is between 17 nm/min and 49 nm/min.

14. The method according to claim 1, further comprising the steps of providing a second hydride $Si_2H_6$ and forming a second radical $SiH_3$ from the second hydride.

15. The method according to claim 1, wherein the monocrystalline IV-IV layer is a GeSn layer.

16. The method according to claim 14, further comprising:
transporting $SiH_3$ to the surface of the IV substrate, decomposing Si from $SiH_3$, depositing Si together with the first element and the second element to form the monocrystalline IV-IV layer;

wherein the monocrystalline IV-IV layer is a $Si_yGe_{1-x-y}Sn$ layer, with x>0.08 and y≤1.

17. The method according to claim 1, wherein the inert carrier gas is not $H_2$.

18. A method for monolithically depositing a monocrystalline IV-IV layer that glows when excited and that is composed of a plurality of elements of the IV main group, having a dislocation density less than $10^6$ $cm^{-2}$, on a IV substrate, of atoms of the IV main group, comprising the following steps:

providing a hydride of a first element (A) being C, Si, or Ge, with a structure $A_nH_m$, wherein n, m are natural numbers;

providing a chloride of a second element (B) being C, Si, Ge, or Sn, with a structure $B_kCl_l$, wherein k, l are natural numbers;

decomposing the hydride such that the hydride produces a radical with a structure $A_nH_{m'}$, wherein m' is a natural number less than m;

heating the IV substrate to a substrate temperature that is such that a growth rate of the monocrystalline IV-IV layer of less than 1 nm/h would take place without providing the chloride, wherein providing the chloride leads to growth rates of the monocrystalline IV-IV layer between 15 nm/min and 50 nm/min;

producing a carrier gas flow of an inert carrier gas;

transporting the chloride and the radical of the hydride to a surface of the IV substrate at a total pressure of at most 300 mbar;

decomposing the first element (A) from the radical of the hydride and decomposing the second element (B) from the chloride with an exothermic first reaction between the radicals of the hydride and the chloride at the surface of the IV substrate, wherein atoms of the first element (A) and atoms of the second element (B) remain at the surface of the IV substrate as a reaction product, wherein heat produced by the exothermic first reaction is absorbed at the same time by an endothermic second reaction at the surface of the IV substrate, wherein the endothermic reaction is a decomposition reaction of the radical of the hydride, wherein the atoms of the first element remain at the surface of the IV substrate; and depositing the first element (A) and the second element (B) to form the monocrystalline IV-IV layer on the surface of the IV substrate, having a thickness of at least 200 nm, wherein the heat from the exothermic reaction heats the surface of the monocrystalline IV-IV layer to grow a crystal layer in a non-equilibrium state.

* * * * *